US011810991B2

(12) United States Patent
Lee et al.

(10) Patent No.: US 11,810,991 B2
(45) Date of Patent: Nov. 7, 2023

(54) SOLAR CELL PANEL

(71) Applicant: LG ELECTRONICS INC., Seoul (KR)

(72) Inventors: Jongha Lee, Seoul (KR); Juseok Kim, Seoul (KR); Seiyoung Mun, Seoul (KR); Sanghwan Park, Seoul (KR)

(73) Assignee: LG ELECTRONICS INC., Seoul (KR)

(*) Notice: Subject to any disclaimer, the term of this patent is extended or adjusted under 35 U.S.C. 154(b) by 59 days.

(21) Appl. No.: 16/593,525

(22) Filed: Oct. 4, 2019

(65) Prior Publication Data
US 2020/0111927 A1 Apr. 9, 2020

(30) Foreign Application Priority Data

Oct. 5, 2018 (KR) .................. 10-2018-0118788

(51) Int. Cl.
*H01L 31/05* (2014.01)
*H01L 31/02* (2006.01)
(Continued)

(52) U.S. Cl.
CPC .... *H01L 31/0508* (2013.01); *H01L 31/02008* (2013.01); *H01L 31/022433* (2013.01); *H01L 31/0488* (2013.01)

(58) Field of Classification Search
CPC ........... H01L 31/0508; H01L 31/02008; H01L 31/022433; H01L 31/0488;
(Continued)

(56) References Cited

U.S. PATENT DOCUMENTS

2011/0048505 A1* 3/2011 Bunea ................. H01L 31/0481
136/251
2012/0247554 A1 10/2012 Wootton
(Continued)

FOREIGN PATENT DOCUMENTS

JP 2005-536894 A 12/2005
JP JF2006-278704 A 10/2006
(Continued)

OTHER PUBLICATIONS

Buck et al., "Large Area Screen Printed N-Type MC-SI Solar Cells with B-Emitter: Efficiencies Close to 15% and Innovative Module Interconnection," 2006 IEEE 4th World Conference on Photovoltaic Energy Conference, Jan. 15, 2007, 4 pages total.

*Primary Examiner* — Michael Y Sun
(74) *Attorney, Agent, or Firm* — Birch, Stewart, Kolasch & Birch, LLP

(57) ABSTRACT

A solar cell panel according to the present embodiment includes a solar cell string including a plurality of solar cells and a plurality of wiring members connecting the plurality of solar cells in first direction, a sealing member sealing the solar cell string, a first cover member positioned on one surface of the solar cell string on the sealing member and a second cover member positioned on other surface of the solar cell string on the sealing member, wherein the plurality of wiring members positioned in at least one of the plurality of solar cells include, a first wiring member having a first width, and a second wiring member having a second width less than the first width and positioned outer to the first wiring member.

17 Claims, 10 Drawing Sheets

(51) Int. Cl.
  *H01L 31/0224* (2006.01)
  *H01L 31/048* (2014.01)
(58) Field of Classification Search
  CPC ........... H01L 31/02002; H01L 31/0203; H01L 31/048; Y02E 10/50
  See application file for complete search history.

(56) References Cited

U.S. PATENT DOCUMENTS

2016/0093752 A1    3/2016  Kim et al.
2016/0322527 A1*  11/2016  Hwang ............... H01L 31/0201

FOREIGN PATENT DOCUMENTS

| | | |
|---|---|---|
| JP | 2015-85303 A | 4/2015 |
| JP | 2015-119008 A | 6/2015 |
| JP | 2016-5002 A | 1/2016 |
| JP | 2016-72637 A | 5/2016 |
| JP | 2017-117877 A | 6/2017 |
| KR | 10-2016-0036378 A | 4/2016 |
| KR | 10-2017-0075219 A | 7/2017 |
| KR | 10-2017-0091571 A | 8/2017 |

\* cited by examiner

SOLAR CELL PANEL

CROSS-REFERENCE TO RELATED APPLICATION

This application claims priority to and the benefit of Korean Patent Application No. 10-2018-0118788 filed in the Korean Intellectual Property Office on Oct. 5, 2018, the entire contents of which are incorporated herein by reference.

STATEMENT REGARDING SPONSORED RESEARCH OR DEVELOPMENT

This work was supported by the Korea Institute of Energy Technology Evaluation and Planning (KETEP) and the Ministry of Trade, Industry & Energy (MOTIE) of the Republic of Korea (No. 1415148844).

BACKGROUND OF THE INVENTION

Field of the Invention

Embodiments of the invention relate to a solar cell panel, and more particularly, to a solar cell panel having an improved structure.

Description of the Related Art

A plurality of solar cells are connected by ribbons, interconnectors, and the like, and are protected by sealing members and cover members to produce solar cell panels. As a result, the solar cell panels can have desired outputs and can be safely protected even when exposed to an external environment for a long period of time.

The solar cell panels including the various members are integrated by a lamination process for applying heat and pressure. A part that receives a large load due to the pressure applied during the lamination process can have characteristics different from those of other parts, so that when the solar cell panels are used for a long period of time, undesirable problems can occur in the part. These problems can be more serious when the cover members constituting both outer surfaces of the solar panel are composed of a glass substrate and a larger pressure is provided.

For example, in the case where each of the cover members forming the both outer surfaces of the solar cell panel is composed of a glass substrate, the thickness of the sealing members at the edges of the solar cell panel is reduced by the weight of the cover member during the lamination process. When a thermal cycle test in which the temperature is repeatedly changed in the solar cell panel is performed, problems such as damage or disconnection of the ribbon, the interconnector, and the like can be caused at the edge of the solar cell panel where the relatively thin sealing members are positioned. These problems can occur more seriously when the thickness of the ribbon, the interconnector, etc. is relatively large in comparison with the width.

SUMMARY OF THE INVENTION

An object of the present invention is to provide a solar cell panel capable of improving long-term reliability with a simple structure.

In particular, the present invention is intended to provide a solar cell panel capable of preventing damage or disconnection of wiring members which can occur when a front cover member and a back cover member are composed of a glass substrate and the wiring members including a relatively large thickness compared to its width or a circular shape or a rounded part are used.

A solar cell panel according to an embodiment of the present invention includes a solar cell string including a plurality of solar cells and a plurality of wiring members connecting the plurality of solar cells in first direction, a sealing member sealing the solar cell string, a first cover member positioned on one surface of the solar cell string on the sealing member, a second cover member positioned on other surface of the solar cell string on the sealing member, wherein the plurality of wiring members positioned in at least one of the plurality of solar cells include, a first wiring member having a first width, a second wiring member having a second width less than the first width and positioned outside the first wiring member.

The solar cell string can include a first solar cell string positioned close to a first edge of the solar cell panel in an second direction intersecting the first direction and a second solar cell string positioned close to a second edge of the solar cell panel in the second direction, In at least one of a plurality of first solar cells included in the first solar cell string, the second wiring member can be positioned close to a first side of a first solar cell adjacent to the first edge, and wherein in at least one of a plurality of second solar cells included in the second solar cell string, the second wiring member can be positioned close to a second side of a second solar cell adjacent to the second edge.

In the first solar cell, the second wiring member can be provided in one or a plural in a region from the first side to about 15% of a width of the first solar cell along the second direction, and wherein in the second solar cell, the second wiring member can be provided in one or a plural in a region from the second side to about 15% of a width of the second solar cell along the second direction.

A ratio (w2/w1) of the second width (w1) of the second wiring member to the first width (w1) of the first wiring member can be about 0.5 or more.

The ratio (w2/w1) of the second width (w2) of the second wiring member to the first width (w1) of the first wiring member can be about 0.6 to 0.9.

The first width of the first wiring member can be about 200 um to 500 um, or the first or second wiring member has a circular or rounded part.

A number of the second wiring member can be less than a number of the first wiring member.

A thickness of the sealing member positioned on one side of the solar cell panel can be two times or less with respect to the first width of the first wiring member.

Each of the first and second cover members can include a glass substrate.

In the first and second solar cells, the second wiring member can be positioned to be adjacent to the first side of the first solar cell and the second side of the second solar cell, and is not positioned to be adjacent to a second side of the first solar cell and a first side of the second solar cell, or in the first and second solar cells, the second wiring member can be positioned to be adjacent to the first side and the second side of the first solar cell and the first side and the second side of the second solar cell, respectively.

The solar cell string further can include at least one inner solar cell string positioned between the first solar cell string and the second solar cell string, and the second wiring member can be provided in the first and second solar cell strings, and the second wiring member is not provided in the inner solar cell string.

Each of the first and second solar cells can include a semiconductor substrate, a conductive type region positioned in one surface of the semiconductor substrate or on the one surface of the semiconductor substrate, an electrode electrically connected to the conductive type region, wherein the electrode includes a plurality of finger lines parallel to each other, a plurality of bus bars respectively including a plurality of pads electrically connected to the plurality of finger lines and positioned along a direction intersecting the finger lines, and wherein at least one of a size and a number of the plurality of pads of the bus bar corresponding to the second wiring member is greater than a size and a number of the plurality of pads of the bus bar corresponding to the first wiring member.

According to the present embodiment, it is possible to prevent problems such as damage and disconnection of the wiring members that can occur at the edges of the solar cell panel by a simple structure using the wiring members having different widths. Thereby, the long-term reliability of the solar cell panel can be improved while manufacturing the solar cell panel by a simple process. This effect can be particularly doubled in a structure in which the thickness of the sealing member is below a certain level, the wiring member includes a circular shape or a rounded part, the wiring member has a relatively large thickness as compared with the width, or the first and second cover members each include a glass substrate.

DETAILED DESCRIPTION OF THE EMBODIMENTS

Figure 1:
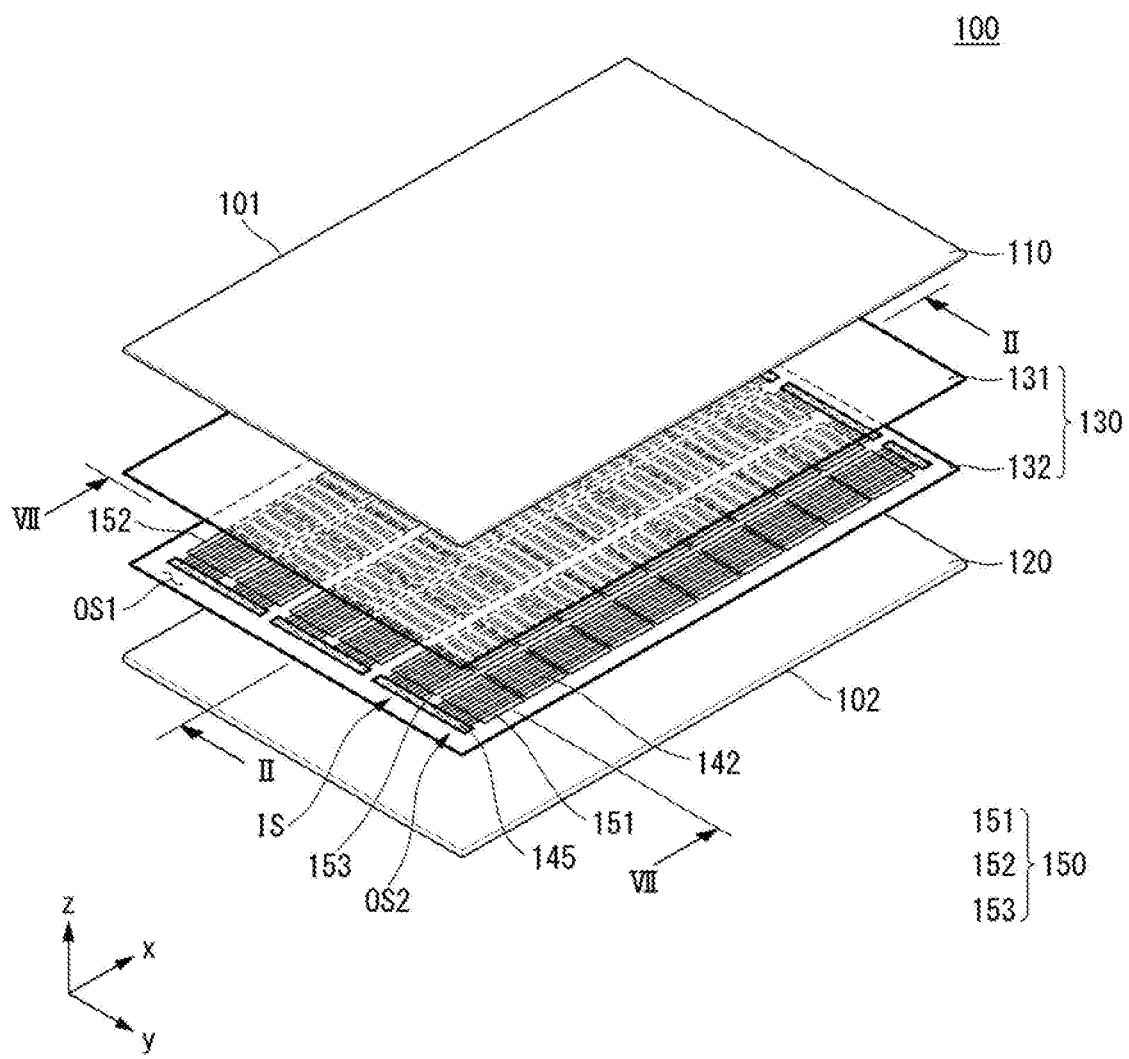
FIG. 1 is a perspective view illustrating a solar cell panel according to an embodiment of the present invention.

Hereinafter, embodiments of the present invention will be described in detail with reference to the accompanying drawings. However, it is needless to say that the present invention is not limited to these embodiments and can be modified into various forms.

In the drawings, illustration of the parts not related to the description is omitted in order to clarify and briefly describe the present invention, and the same reference numerals are used for the same or very similar parts throughout the specification. In the drawings, the thickness, width, and the like are enlarged or reduced to make the explanation more clear, and the thickness, width, etc. of the present invention are not limited to those shown in the drawings.

When a part is referred to as "including" another part throughout the specification, it does not exclude other parts and can further include other parts unless specifically stated otherwise. Further, when a part of a layer, a film, a region, a plate, or the like is referred to as being "on" other part, this includes not only the case where it is "directly on" the other part but also the case where the other part is positioned in the middle. When the part of the layer, the film, the region, the plate, or the like is referred to as being "directly on" the other part, it means that no other part is positioned in the middle.

Hereinafter, a solar cell and a solar cell panel including the solar cell according to an embodiment of the present invention will be described in detail with reference to the accompanying drawings. In the following, the expressions "first", "second", "third", etc. are used only to distinguish each other, but the present invention is not limited thereto.

Figure 2:
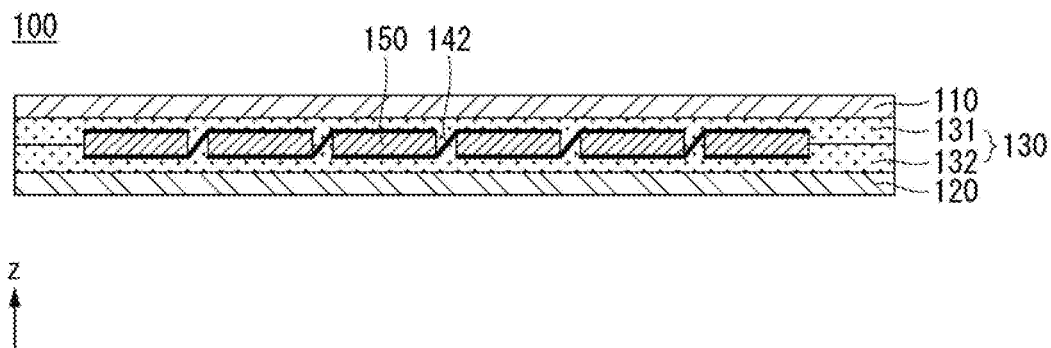
FIG. 2 is a cross-sectional view taken along a line II-II in FIG. 1.

FIG. 1 is a perspective view illustrating a solar cell panel according to an embodiment of the present invention, and FIG. 2 is a cross-sectional view taken along a line II-II in FIG. 1.

Referring to FIGS. 1 and 2, a solar cell panel 100 according to the present embodiment includes a plurality of solar cells 150 and a wiring member (or a wire, an interconnector, etc.) 142 for electrically connecting the plurality of solar cells 150 in first direction. The solar cell panel 100 includes a sealing member 130 that surrounds and seals the solar cell strings OS1, OS2 and IS, a first cover member 110 positioned on a front surface of the solar cell strings OS1, OS2 and IS on the sealing member 130, and a second cover member 120 positioned on a back surface of the solar cell strings OS1, OS2 and IS on the sealing member 130. This will be explained in more detail.

First, the solar cell 150 can include a photoelectric conversion unit that converts the solar cell into electric energy, and an electrode that is electrically connected to the photoelectric conversion unit to collects and transfers a current. The plurality of solar cells 150 can be electrically connected in series, parallel, or series-parallel by the wiring member 142. Specifically, the wiring member 142 electrically connects two neighboring solar cells 150 among the plurality of solar cells 150.

A bus ribbon 145 alternately connects two ends of the wiring member 142 of the solar cell 150 (i.e., the solar cell string OS1, OS2 and IS) connected by the wiring material 142 to form one row. The bus ribbon 145 can be positioned at an end of the solar cell string OS1, OS2 and IS in a direction intersecting the end. This bus ribbon 145 can connect the solar cell strings OS1, OS2 and IS adjacent to each other, or can connect the solar cell string OS1, OS2 and IS to a junction box (not shown) that prevents reverse flow of the current. The material, shape, connection structure, etc. of the bus ribbon 145 can be variously modified, and the present invention is not limited thereto.

The sealing member 130 can include a first sealing member 131 positioned on the front surface of the solar cell 150 connected by the wiring member 142, and a second sealing member 132 positioned on the back surface of the solar cell 150. The first sealing member 131 and the second sealing member 132 prevent moisture and oxygen from entering and chemically bind each element of the solar cell panel 100. The first and second sealing members 131 and 132 can be made of an insulating material having transparency and adhesiveness. For example, an ethylene-vinyl acetate copolymer resin (EVA), a polyvinyl butyral, a silicon resin, an ester-based resin, an olefin-based resin, or the like can be used for the first sealing member 131 and the second sealing member 132. The second cover member 120, the second sealing member 132, the solar cell 150, the first sealing member 131, and the first cover member 110 are integrated to form the solar cell panel 100 by a lamination process or the like using the first and second sealing members 131 and 132.

The first cover member 110 is positioned on the first sealing member 131 to constitute the front surface of the solar cell panel 100, and the second cover member 120 is positioned on the second sealing member 132 to constitute the back surface of the solar cell panel 100. The first cover member 110 and the second cover member 120 can be made of an insulating material capable of protecting the solar cell 150 from external shock, moisture, ultraviolet rays, or the like. For example, in this embodiment, each of the first and second cover members 110 and 120 can include a glass substrate, and can have excellent light transmittance, insulation characteristics, durability, and the like. In addition, a bi-facial structure or a transparent panel structure capable of utilizing light incident on both surfaces of the solar cell panel 100 can improve the output.

However, the present invention is not limited thereto. Accordingly, the first and second sealing members 131 and 132, the first cover member 110, or the second cover member 120 can include various materials other than those described above, and can have various shapes. For example, the first cover member 110 or the second cover member 120 can have various shapes (for example, a substrate, a film, a sheet, etc.) or materials, and as one example, the second cover member 120 can be made of a sheet or a film composed of a light transmitting material, a non-light transmitting material, a reflective material, etc.

Figure 3:
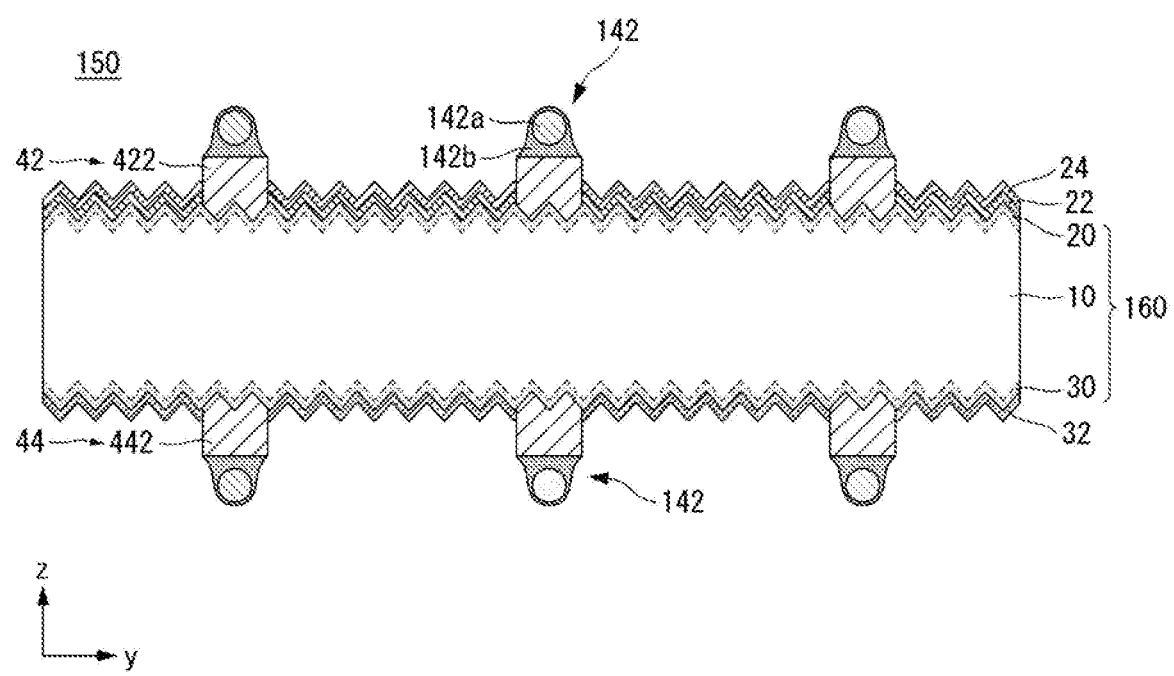
FIG. 3 is a partial cross-sectional view illustrating a solar cell and a wiring member connected thereto which are included in a solar cell panel shown in FIG. 1.

The solar cell 150 and the wiring member 142 connected thereto according to the embodiment of the present invention will be described in more detail with reference to FIG. 3. FIG. 3 is a partial cross-sectional view illustrating the solar cell 150 and the wiring member 142 connected thereto which are included in the solar cell panel 100 shown in FIG. 1. For simplicity, electrodes 42 and 44 are schematically shown in FIG. 3.

Referring to FIG. 3, the solar cell 150 includes a semiconductor substrate 160, conductive type regions 20 and 30 formed at or on the semiconductor substrate 160, and electrodes 42 and 44 connected to the conductive type regions 20 and 30. The conductive type regions 20 and 30 can include a first conductive type region 20 having a first conductive type and a second conductive type region 30 having a second conductive type. The electrodes 42 and 44 can include a first electrode 42 connected to the first conductive type region 20 and a second electrode 44 connected to the second conductive type region 30. Furthermore, the solar cell 150 can further include first and second passivation layers 22 and 32, an anti-reflection layer 24, and the like.

The semiconductor substrate 160 can be composed of a crystalline semiconductor (for example, a single crystal or polycrystalline semiconductor, for example, a single crystal or polycrystalline silicon) including a single semiconductor material (for example, a group 4 element). Then, since the semiconductor substrate 160 having a high degree of crystallinity and having few defects is used as a base, the solar cell 150 can have excellent electrical characteristics.

The front surface and/or the back surface of the semiconductor substrate 160 can be textured to have unevenness. The unevenness can have, for example, a pyramid shape having an irregular size, whose outer surface is composed of the plane (111) of the semiconductor substrate 160. As a result, the reflectance of light can be reduced if having a relatively large surface roughness. However, the present invention is not limited thereto.

In this embodiment, the semiconductor substrate 160 includes a base region 10 having the first or second conductive type by doping a first or second conductive type dopant with a lower doping concentration than the first or second conductive type region 20, 30. As an example, the base region 10 can have the second conductive type in this embodiment.

As an example, the first conductive type region 20 can constitute an emitter region that forms a p-n junction with the base region 10. The second conductive type region 30 can form a back surface field to form a back field region for preventing recombination. Here, the first and second conductive type regions 20 and 30 can be formed as a whole on the front surface and the back surface of the semiconductor substrate 160. Thus, the first and second conductive type regions 20 and 30 can be formed with a sufficient area without additional patterning. However, the present invention is not limited thereto.

In this embodiment, the base region 10 and the conductive type regions 20 and 30 constituting the semiconductor substrate 160 are exemplified as regions having a crystal structure of the semiconductor substrate 160 and different conductive type, doping concentration. That is, it is illustrated that the conductive type regions 20 and 30 are doped regions constituting a part of the semiconductor substrate 160. However, the present invention is not limited thereto. Therefore, at least one of the first conductive type region 20 and the second conductive type region 30 can be formed of an amorphous, microcrystalline or polycrystalline semiconductor layer or the like, which is formed on the semiconductor substrate 160 as a separate layer. Other variations are possible.

The first conductive type dopant included in the first conductive type region 20 can be an n-type or p-type dopant, and the second conductive type dopant included in the base region 10 and the second conductive type region 30 can be a p-type or n-type dopant. Group 3 elements such as boron (B), aluminum (Al), gallium (Ga), or indium (In) can be used as the p-type dopant, and group 5 elements such as phosphorus (P), arsenic (As), bismuth (Bi), and antimony (Sb) can be used as the n-type dopant. The second conductive type dopant in the base region 10 and the second conductive type dopant in the second conductive type region 30 can be the same material or different materials.

For example, the first conductive type region 20 can have a p-type, the base region 10 and the second conductive type region 30 can have an n-type. Then, holes having a slower moving speed than electrons can move to the front surface of the semiconductor substrate 160, rather than the back surface thereof, thereby improving the conversion efficiency. However, the present invention is not limited thereto, and the opposite case is also possible.

An insulating layer such as the first and second passivation layers 22 and 32 for immobilizing defects of the conductive type regions 20 and 30 and the anti-reflection layer 24 for preventing reflection of light can be formed on the surface of the semiconductor substrate 160. Such an insulating layer can be composed of an undoped insulating layer which does not contain a dopant separately. The first and second passivation layers 22 and 32 and the anti-reflection layer 24 can be formed substantially entirely on the front surface and back surface of the semiconductor substrate 160 except for parts (more precisely, parts where a first or second opening is formed) corresponding to the first or second electrode 42, 44.

For example, the first or second passivation layer 22, 32 or the anti-reflection layer 24 can have a silicon nitride layer, a silicon nitride layer containing hydrogen, a silicon oxide layer, a silicon oxynitride layer, an aluminum oxide layer, any one single layer selected from a group consisting of $MgF_2$, ZnS, $TiO_2$ and $CeO_2$ or a multi-layered structure in which two or more layers are combined. For example, the first or second passivation layer 22 or 32 can include a silicon oxide layer, a silicon nitride layer, or the like having a fixed positive charge when the first or second conductive type region 20 or 30 has an n-type, and can include an aluminum oxide layer, or the like having a fixed negative charge when the first or second conductive type region 20 or 30 has a p-type. As one example, the anti-reflection layer 24 can include silicon nitride. In addition, the material of the insulating layer, the multi-layered structure, and the like can be variously modified.

The first electrode 42 is electrically connected to the first conductive type region 20 through a first opening and the second electrode 44 is electrically connected to the second conductive type region 30 through a second opening. The first and second electrodes 42 and 44 are made of various materials (for example, metal materials) and can be formed to have various shapes. The shape of the first and second electrodes 42 and 44 will be described later.

As described above, in this embodiment, since the first and second electrodes 42 and 44 of the solar cell 150 have a certain pattern, the solar cell 150 has a bi-facial structure in which light can be incident on the front surface and the back surface of the semiconductor substrate 160. Accordingly, the amount of light used in the solar cell 150 can be increased to contribute to the efficiency improvement of the solar cell 150.

However, the present invention is not limited thereto, and it is also possible that the second electrode 44 is formed entirely on the back surface of the semiconductor substrate 160. It is also possible that the first and second conductive type regions 20 and 30 and the first and second electrodes 42 and 44 are positioned together on one surface (for example, the back surface) of the semiconductor substrate 160, and it is also possible that at least one of the first and second conductive type regions 20 and 30 is formed over both surface of the semiconductor substrate 160. That is, the solar cell 150 described above is merely an example, and the present invention is not limited thereto.

The solar cell 150 described above is electrically connected to the neighboring solar cell 150 by the wiring member 142 positioned (e.g., in contact with) on the first electrode 42 or the second electrode 44, and this will be described in more detail with reference to FIG. 4 together with FIG. 1 to FIG. 3.

Figure 4:
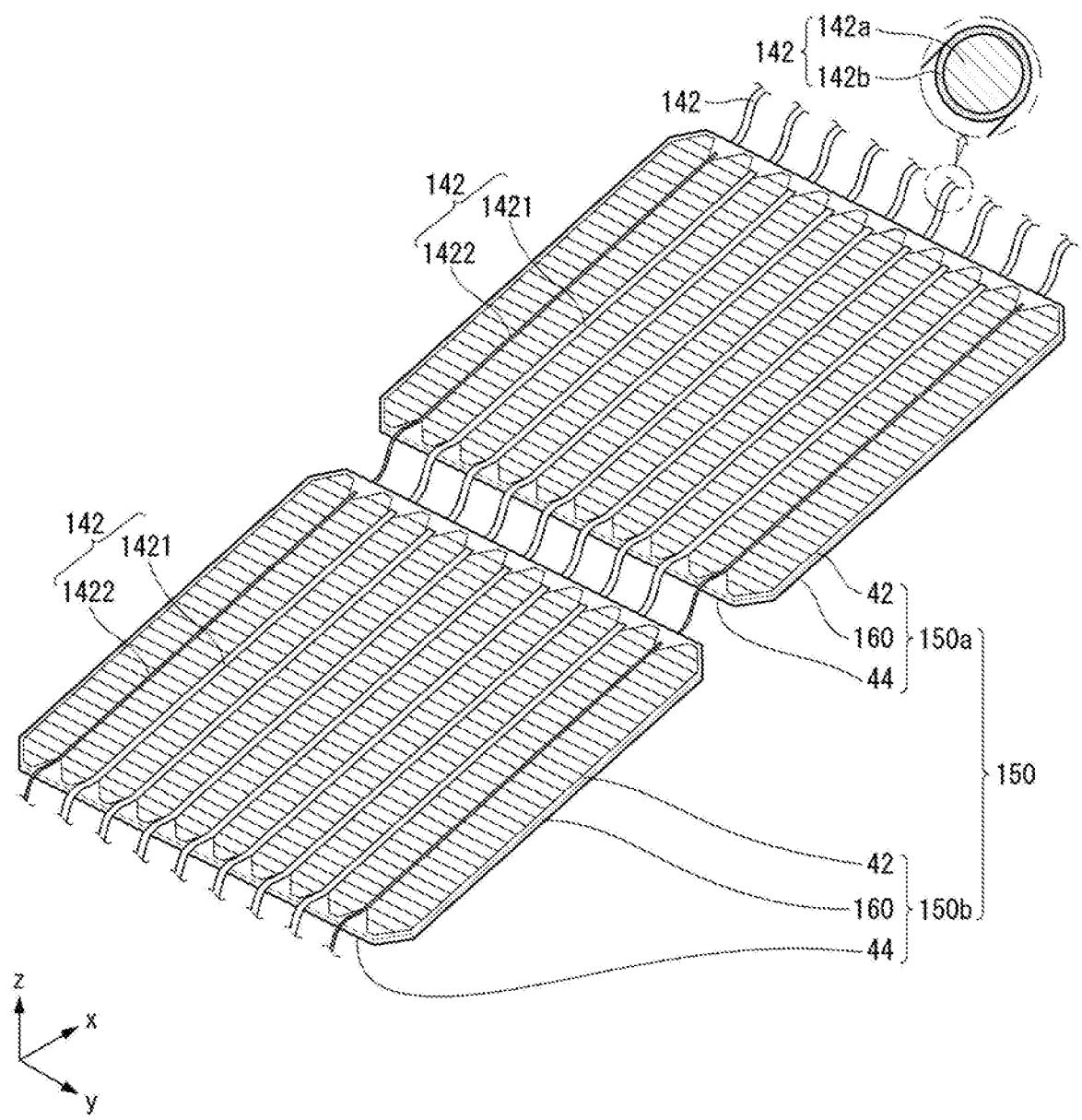
FIG. 4 is a perspective view schematically illustrating two neighboring solar cells which are included in a solar cell panel shown in FIG. 1 and connected by a wiring member.

FIG. 4 is a perspective view schematically illustrating two neighboring solar cells 150a, 150b which are included in the solar cell panel 100 shown in FIG. 1 and connected by the wiring member 142. In FIG. 4, the two neighboring solar cells 150a, 150b are schematically shown mainly on the semiconductor substrate 160 and the electrodes 42 and 44.

As shown in FIGS. 1 to 4, the wiring member 142 connects the first electrode 42 positioned on a front surface of one solar cell 150a and the second electrode 44 positioned on a back surface of neighboring solar cell 150b positioned at one side (lower left of the drawing) of the one solar cell 150a. Another wiring member 142 connects the second electrode 44 positioned on the back surface of the one solar cell 150a and the first electrode 42 positioned on the front surface of another solar cell to be positioned on another side (upper right of the drawing) of the one solar cell 150a. Other wiring member 142 connects the first electrode 42 positioned on the front surface of the neighboring solar cell 150b and the second electrode 44 positioned on the back surface of other solar cell to be positioned at one side (lower left of the drawing) of the neighboring solar cell 150b. Accordingly, the plurality of solar cells 150 can be connected to each other by the wiring member 142 to form one row. Hereinafter, the description of the wiring member 142 can be applied to all the wiring member 142 connecting two neighboring solar cells 150.

At this time, the plurality of wiring members 142 can be extended to be positioned along first direction (an x-axis direction in the drawing, a direction intersecting a first finger line (reference numeral 42a in FIG. 5, hereafter the same), or an extending direction of a first bus bar (reference numeral 42b in FIG. 5 hereafter the same)) on one surface of each solar cell 150 to improve electrical connection characteristics of neighboring solar cells 150.

In this embodiment, the wiring member 142 can be formed of a wire having a width smaller than that of a ribbon having a relatively wide width (for example, more than 1 mm) which has been used conventionally. For example, a maximum width of the wiring member 142 can be 1 mm or less (for example, 500 μm or less). Here, the maximum width of the wiring member 142 can mean a largest width among widths passing the center of the wiring member 142. When the wiring member 142 has such a maximum width, it can be smoothly attached to the solar cell 150 while the resistance of the wiring member 142 can be kept low and the optical loss can be minimized.

The number of the wiring members 142 can be greater than the number (for example, 2 to 5) of the conventional ribbons on the basis of one surface of each solar cell 150. Then, a movement distance of carriers can be reduced by a large number of the wiring members 142 while minimizing the optical loss and material cost by the wiring member 142 having a small width. Thus, the efficiency of the solar cell 150 and the output of the solar cell panel 100 can be improved by reducing the movement distance of the carriers while reducing the optical loss, and productivity of the solar cell panel 100 can be improved by reducing the material cost due to the wiring member 142.

In order to prevent the process of attaching the wiring member 142 to the solar cell 150 from becoming complicated when the number of the wiring member 142 having the small width is used in a large number, in this embodiment, the wiring member 142 can have a structure including a core layer 142a and a solder layer 142b formed on the surface of the core layer 142a. Then, a large number of the wiring member 142 can be effectively attached by the process of applying heat and pressure while the wiring member 142 is placed on the solar cell 150.

The wiring member 142 or the core layer 142a, which is included in the wiring material 142 and occupies most of the wiring member 142, can include rounded parts. That is, at least a part of the cross section of the wiring member 142 or the core layer 142*a* can include a circle, a part of a circle, an ellipse, a part of an ellipse, or a part made of a curve.

If it has such a shape, the wiring member 142 is formed in a structure in which the solder layer 142*b* is entirely positioned on the surface of the core layer 142*a*, the process of separately applying the solder material and the like are omitted, so that the wiring member 142 can be attached by positioning the wiring member 142 directly on the solar cell 150. Thus, the process of attaching the wiring member 142 can be simplified. In addition, light reflected by the wiring member 142 can be re-incident on the solar cell 150 and reused by being reflected or diffused by the rounded parts of the wiring member 142. Accordingly, since the amount of light incident on the solar cell 150 is increased, the efficiency of the solar cell 150 and the output of the solar cell panel 100 can be improved. However, the present invention is not limited thereto. Therefore, the wire constituting the wiring member 142 can have a polygonal shape such as a quadrangle, or can have various other shapes.

At this time, the number of the wiring members 142 can be 6 to 33 (for example, 8 to 33, for example, 10 to 33, particularly 10 to 15), and they can be spaced apart from each other at a uniform distance. The plurality of the wiring member 142 in each solar cell 150 can have a symmetrical shape when viewed in an extending direction of the first finger line 42*a*. Thus, a sufficient number of the wiring members 142 can be provided, and the movement distance of the carriers can be minimized.

In this embodiment, the wiring member 142 can include the core layer 142*a* made of metals and the solder layer 142*b* that is formed on the surface of the core layer 142*a* and includes solder material to enable soldering with the electrodes 42,44, That is, the solder layer 142*b* can serve as a kind of adhesive layer. For example, the core layer 142*a* can include Ni, Cu, Ag, Al, or the like as a main material (for example, a material containing 50 wt % or more, more specifically, a material containing 90 wt % or more). The solder layer 142*b* can include a solder material such as Pb, Sn, SnIn, SnBi, SnPb, SnPbAg, SnCuAg, SnCu, or the like as a main material. However, the present invention is not limited thereto, and the core layer 142*a* and the solder layer 142*b* can include various materials.

On the other hand, when the wiring member 142 is attached to the solar cell 150 by a tabbing process, as shown in FIG. 3, a shape of the solder layer 142*b* is changed in a part of the wiring member 142 attached to or connected to the solar cell 150.

More specifically, the wiring member 142 is attached to at least pads 422 and 442 by the solder layer 142*b*. At this time, the solder layer 142*b* of each wiring member 142 is separately positioned with other wiring member 142 or solder layer 142*b*. When the wiring member 142 is attached to the solar cell 150 by the tabbing process, each solder layer 142*b* flows down to the first or second electrodes 42, 44 (more specifically, the pads 422 and 424) as a whole during the tabbing process, and a width of the solder layer 142*b* can gradually increase toward the pads 422, 442 at a part adjacent to each pad part 422, 442 or a part positioned between the pads 422, 442 and the core layer 142*a*. As one example, the part adjacent to the pads 422 and 442 in the solder layer 142*b* can have a width equal to or greater than a diameter of the core layer 142*a*. At this time, the width of the solder layer 142*b* can be equal to or less than a width of the pads 422, 442.

More specifically, the solder layer 142*b* has a shape protruding toward the outside of the solar cell 150 along the shape of the core layer 142*a* in an upper part of the core layer 142*a*. On the other hand, the solder layer 142*b* includes a part having a concave shape with respect to the outside of the solar cell 150 in a lower part of the core layer 142*a* or a part adjacent to the pads 422 and 442. As a result, an inflection point where the curvature changes is positioned on the side of the solder layer 142*b*. It can be seen that the wiring member 142 are individually attached and fixed by the solder layer 142*b* without being inserted or covered in a separate layer, film, or the like from this shape of the solder layer 142*b*. The solar cell 150 and the wiring member 142 can be connected by a simple structure and a process by fixing the wiring member 142 by the solder layer 142*b* without using a separate layer or a film. Particularly, the wiring member 142 having a narrow width and a rounded shape as in the present embodiment can be attached without using a separate layer, a film, (for example, a conductive adhesive film including a resin and a conductive material) or the like, so that the process cost and time of the wiring member 142 can be minimized.

On the other hand, the part of the wiring member 142 positioned between the neighboring solar cells 150 (that is, outside the solar cell 150), which is not applied with heat or is applied with relatively less heat even after the tabbing process, can have a shape in which the solder layer 142*b* has a uniform thickness as shown in FIG. 4.

According to the present embodiment, optical loss can be minimized by diffused reflection or the like using a wire-shaped wiring material 142, and it is possible to reduce the movement path of the carrier by increasing the number of the wiring member 142 and reducing a pitch of the wiring member 142. In addition, the width or diameter of the wiring member 142 can be reduced, so that the material cost can be greatly reduced. Accordingly, the efficiency of the solar cell 150 and the output of the solar cell panel 100 can be improved.

Figure 5:
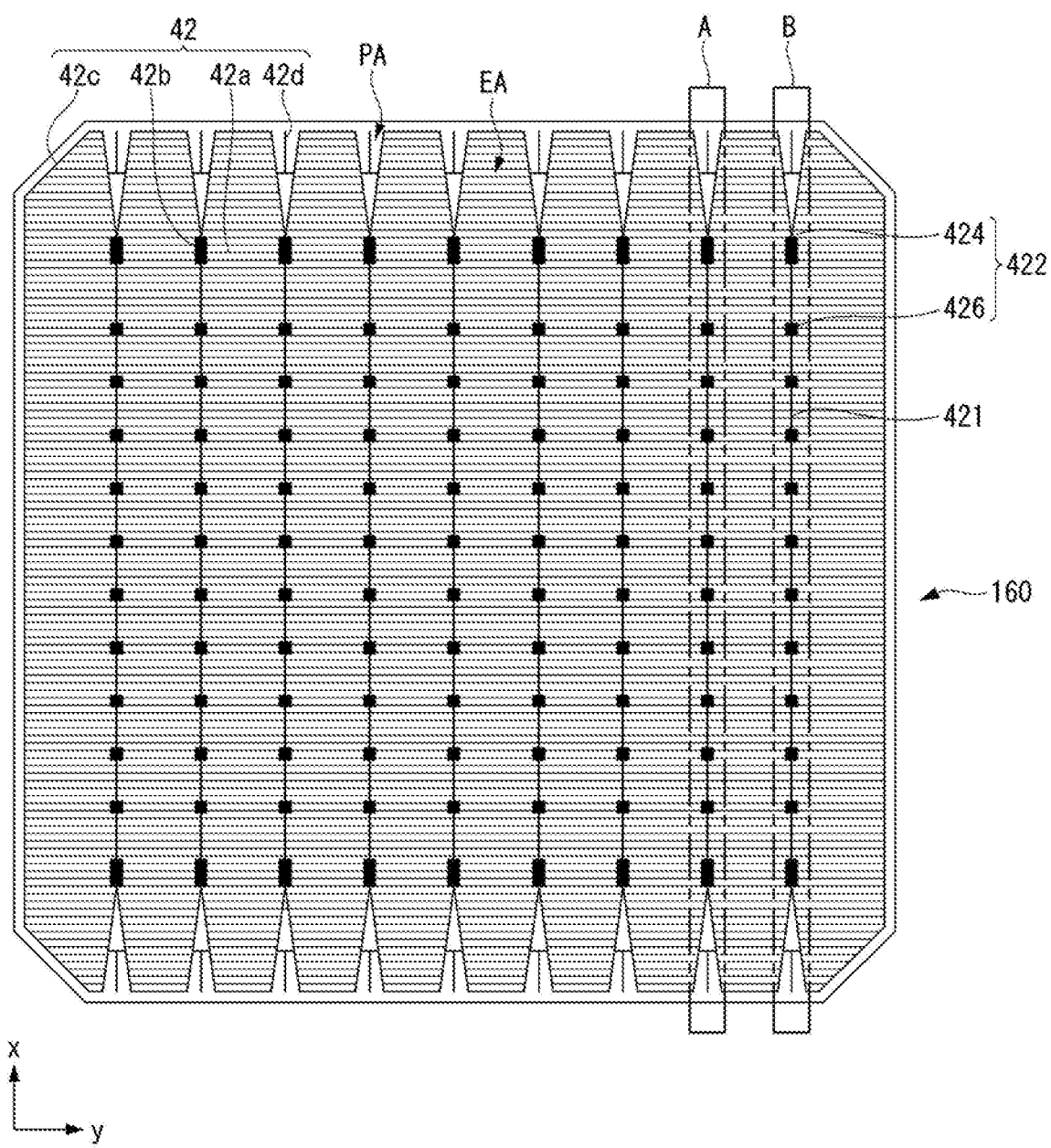
FIG. 5 is a front plan view of a solar cell shown in FIG. 4.

Referring to FIG. 5 with FIGS. 1 to 4, an example of the electrodes 42 and 44 of the solar cell 150 to which the wiring member 142 according to an embodiment of the present invention is attached will be described in detail. Hereinafter, with reference to FIG. 5 the first electrode 42 will be described in detail, and for the second electrode 44, the same or similar parts as the first electrode 42 and the different parts from the first electrode 42 will be described.

FIG. 5 is a front plan view of the solar cell 150 shown in FIG. 4.

Referring to FIGS. 1 to 5, in this embodiment, the first electrode 42 includes a plurality of first finger lines 42*a* being extended in a first direction (an y-axis direction in the drawing) and positioned parallel to each other, and a first bus bar 42*b* formed in a second direction (an x-axis direction in the drawing) intersecting (for example, orthogonal) with the first finger line 42*a* and electrically connected to the first finger line 42*a* and connected or attached to the wiring member 142. In the drawing, it is further formed a rim line 42*c* that connects the ends of the plurality of first finger lines 42*a* as a whole in the vicinity of both side edges. The rim line 42*c* can have the same or similar width as the first finger line 42*a* and can be composed of the same material as the first finger line 42*a*. However, it is also possible not to include the rim line 42*c*.

At this time, in this embodiment, the solar cell 150 (or the semiconductor substrate 160) can be partitioned into an electrode area EA and an edge area PA. Here, the electrode area EA can be an area in which the first finger lines 42*a* formed in parallel to each other are arranged at a uniform pitch. The electrode area EA can include a plurality of electrode areas EA partitioned by the wiring member 142. The edge area PA is an area positioned between two adjacent electrode areas EA and positioned adjacent to an edge of the semiconductor substrate 160 or the solar cell 150 outside a plurality of first pad part 422 (particularly, first outer pads 424). At this time, the edge area PA can be an area where an electrode part 42d is positioned at a density lower than a density of the first finger line 42a of the electrode area EA, or an area where the electrode part 42d is not positioned. In the drawing, it is illustrated that the electrode parts 42d positioned on both sides of each other have the same shape. However, the present invention is not limited thereto, and various other modifications are possible.

In this embodiment, at least a part of the plurality of first finger lines 42a include a contact part which is in direct contact with the first conductive type region 20, and serve to collect carriers generated by the photoelectric conversion from the first conductive type region 20. In one example, the plurality of first finger lines 42a can be extended in parallel to each other and spaced apart from each other so as to have a constant pitch.

In this embodiment, the first bus bar 42b can include the plurality of first pad part 422 positioned in the second direction and can further include a first line part 421 which is elongated with a relatively narrow width along a direction in which the wiring member 142 is connected. The first pad part 422 can improve the adhesion with the wiring member 142 and reduce the contact resistance, and the first line part 421 can minimize the optical loss. The first line part 421 can provide a path through which the carrier can bypass when some of the first finger lines 42a are broken. The wiring material 142 can be attached to the first line part 421, or the wiring member 142 can be placed on the first line part 421 in a state where the wiring member 142 is not attached to the first line part 421.

More specifically, the plurality of first pads 422 includes the outer pad 424 positioned to be adjacent to the edge of the semiconductor substrate 160 in the second direction, and an inner pad 426 positioned inside the outer pad. Here, the outer pad 424 can mean two pads positioned to be closest to each of the two side edges when viewed in the second direction among the plurality of first pads 422, and the first inner pad 426 can mean a pad positioned between two first outer pads 424. Here, since the outer/inner reference is based on only the plurality of first pads 422, unlike the drawing, the first line part 421 can be positioned outside the first outer pad 424.

A width of the first pad part 422 in the first direction can be greater than a width of the first line part 421 in the first direction and a width of the first finger line 42a in the second direction, respectively. A length of the first pad part 422 in the first direction can be greater than the width of the first line part 421 in the first direction and the width of the first finger line 42a in the second direction, respectively. The width of the first line part 421 can be equal to or less than a width of the wiring member 142 and the width of the first pad part 422 can be equal to or greater than the width of the wiring member 142. As described above, if the first pad part 422 has a sufficient width, the first pad part 422 can improve the adhesion with the wiring member 142 and reduce the contact resistance. The width of the wiring member 142 can be less than a pitch of the first finger line 42a and can be greater than the width of the first finger line 42a. However, the present invention is not limited thereto and various modifications are possible.

At this time, a plurality of inner pads 426 can be arranged at a predetermined interval in each first bus bar 42b. For example, 6 to 40 inner pads 426 (e.g., 12 to 24) can be arranged in each first bus bar 42b. Here, each of the first inner pads 426 can be positioned for each of the plurality of first finger lines 42a, and for example, a pitch of the inner pad 426 can be 2 to 20 times (e.g., 3 times or more, 10 times or less) the pitch of the first finger line 42a. However, the number, arrangement, and the like of the first inner pads 426 can be variously modified. In FIG. 5, the inner pads 426 are spaced at equal intervals, but the present invention is not limited thereto. Therefore, the number and density of the first inner pads 426 can be increased in a part where a large force acts.

In the present embodiment, the first outer pads 424 positioned at both ends of the first bus bar 42b of the first electrode 42 are formed to have a larger area (for example, a length) than the first inner pads 426. At this time, even if the widths of the first outer pads 424 determined in relation to the width (or the diameter) of the wiring member 142 are different from each other, they are not related to a contact area of the wiring member 142. Accordingly, the widths of the first outer pad 424 and the first inner pad 426 can be substantially the same in the first direction, and the length of the first outer pad 424 can be greater than the length of the first inner pad 426 in the second direction. Here, substantially the same can mean that they have an error of less than 5%, and a larger area or length can mean having a larger area or length of 5% or more (for example, 10% or more, for example, 20% or more).

The first outer pads 424 are positioned near both side edges of the semiconductor substrate 160 and are last parts in which the wiring member 142 is substantially attached inside the solar cell 150. Accordingly, whether the wiring member 142 is attached or not is determined based on the outer edge of the first outer pad 424, so thermal stress can be generated in the first outer pad 424 rather than the first inner pad 426. In consideration of this, the area of the first outer pad 424 can be larger than that of the first inner pad 426 in this embodiment. Thereby, the attachment area of the first outer pad 424 to the wiring member 142 can be increased to maintain excellent attachment characteristics of the wiring member 142. Accordingly, defects of the solar cell panel 100 can be reduced, and reliability and productivity can be improved. In addition, the area of the first inner pad 426 having a relatively low problem in deterioration of the attachment characteristics of the wiring member 142 can be made relatively small, so that the area of the first electrode 42 can be reduced. However, the present invention is not limited thereto, and the first outer pad 424 can have an area (for example, a length) that is equal to or smaller than the first inner pad 426. Many other variations are possible.

Similarly, the second electrode 44 can include a second pad part 442, a second line part, or a second bus bar corresponding to the first pad part 422, the first line part 421, or the first bus bar 42b, and can further include a second finger line corresponding to the first finger line 42a of the first electrode 42. At this time, the width, pitch, thickness, etc. of the first finger line 42a, the first pad part 422 and the first line part 421 of the first electrodes 42 can be the same as or different from the width, pitch, thickness, etc. of the second finger line, the second pad part 442 and the second line part of the second electrodes 44. The first bus bar 42b and the second bus bar can be formed at the same position and can be formed in the same number. In addition, the second electrode 44 can further include a rim line and/or an electrode part corresponding to the rim line 42c and/or the electrode part 42d of the first electrode 42. If there is no other description, the content of the first electrode 42 can be applied to the second electrode 44 as it is, and the content of the first insulating layer (the first passivation layer 22, anti-reflection layer 24, etc. formed on the front surface of semiconductor substrate 160) in relation to the first electrode 42 can be directly applied to a second insulating layer (the second passivation layer 32 formed on the back surface of the semiconductor substrate 160) in relation to the second electrode 44.

For example, in the present embodiment, the first or second finger lines 42a of the first or second electrodes 42 and 44 can be formed in contact with the first or second conductive type regions 20 and 30 through the insulating layer. The first or second bus bars 42b of the first or second electrodes 42 and 44 can be formed in contact with the first or second conductive type regions 20 and 30 through the insulating layer, or can be spaced apart from the first or second conductive type regions 20 and 30 on the insulating layer. At this time, in cross section, the structures of the first and second finger lines 42a and/or the first and second bus bars 42b in the first electrode 42 and the second electrode 44 can be the same or different from each other.

In the present embodiment, the structures of the edge parts of the solar cell panel 100 can be improved to prevent damage or disconnection of the wiring member 142 at the edge parts of the solar panel 100 in which the thickness of the sealing member 130 can be thinner than other parts during the lamination process. This will be described in more detail with reference to FIGS. 6 and 7 with FIGS. 1 to 5.

Figure 6:
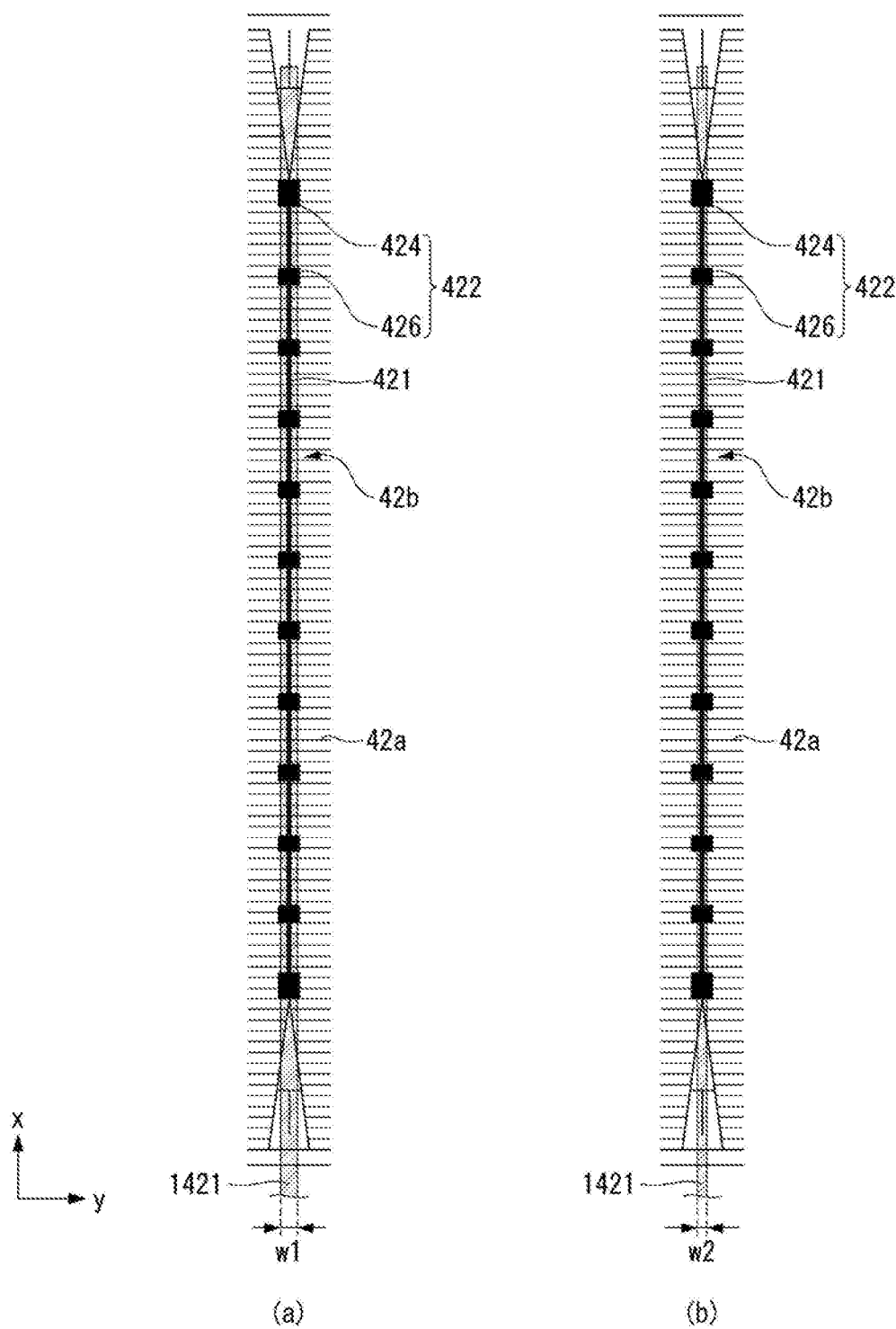
FIG. 6 includes (a) and (b) that are front plan views illustrating enlarged views of a part A and a part B of FIG. 5.
Figure 7:
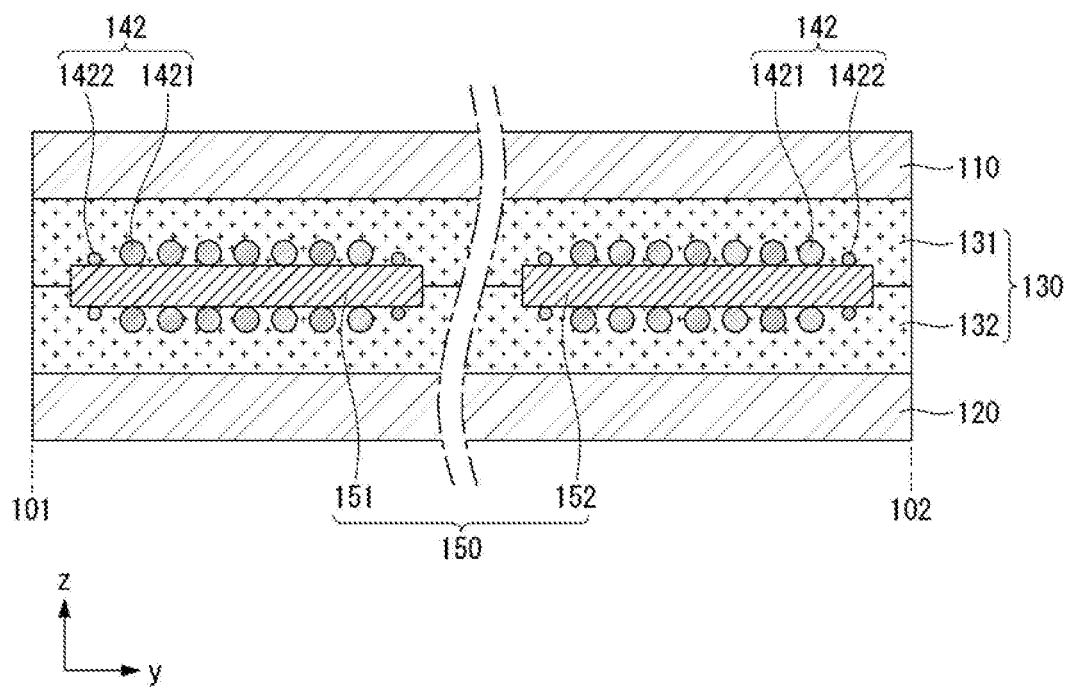
FIG. 7 is a cross-sectional view taken along the line VII-VII of FIG. 1.
Figure 8:
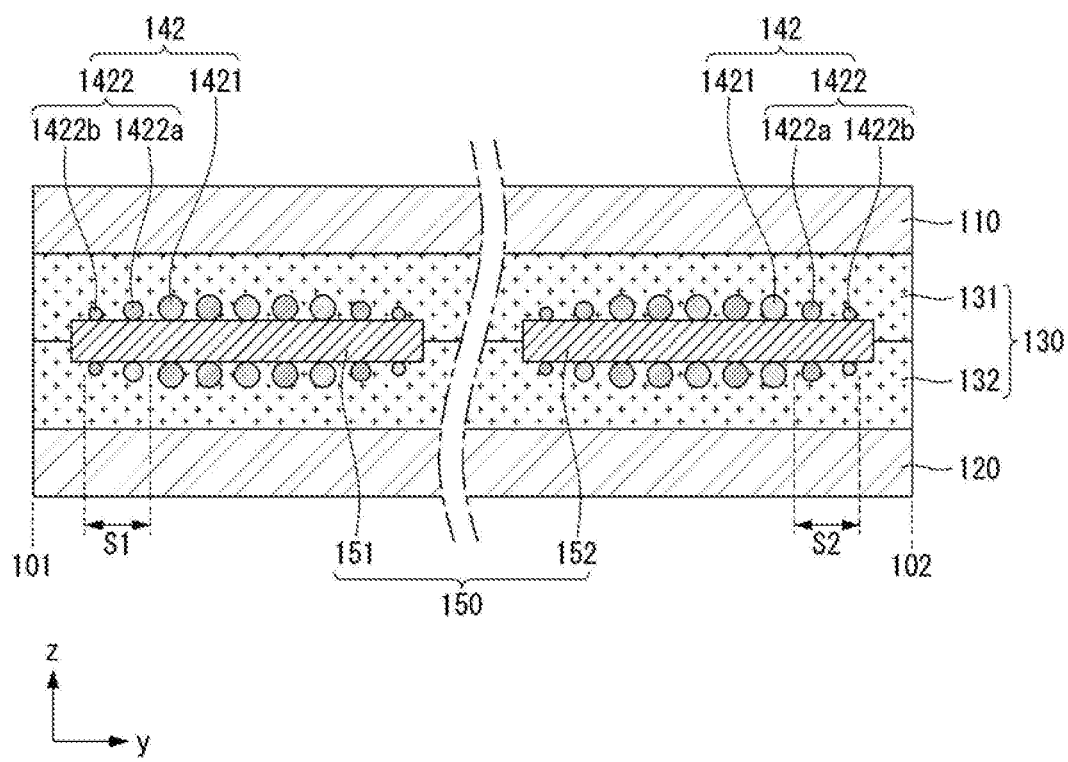
FIG. 8 is a cross-sectional view of a solar cell panel according to a modification of the present invention.
Figure 9:
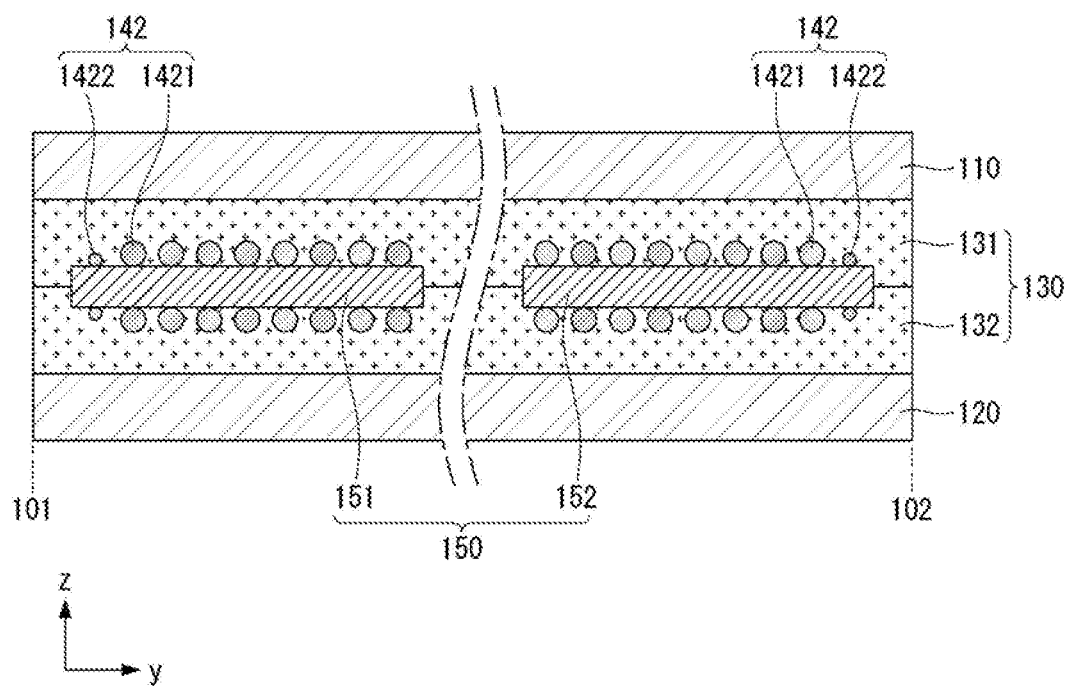
FIG. 9 is a cross-sectional view of a solar cell panel according to another modification of the present invention.

In, FIG. 6, (a) and (b) are front plan views illustrating enlarged views of a part A and a part B of FIG. 5, and FIG. 7 is a cross-sectional view taken along a line VII-VII of FIG. 1. For brief illustration and clear understanding, FIGS. 7 to 9 schematically illustrate the shapes of the solar cell 150 and the wiring member 142.

Referring to FIGS. 1 to 7, as explained earlier, in the present embodiment, each of solar cell strings OS1, OS2, and IS includes a plurality of solar cells 150 and a plurality of wiring members 142 connecting the plurality of solar cells 150 in first direction (an extension direction, a second direction), respectively. The solar cell strings OS1, OS2, and IS can be provided in a plurality so as to be spaced apart from each other in a direction (the second direction, the first direction) intersecting with first direction. More specifically, the plurality of solar cell strings OS1, OS2, and IS can include a first solar cell string (a first outer solar cell string, OS1) positioned at a first edge 101 of the solar panel 100 in the second direction and a second solar cell string (a second outer solar cell string, OS2) positioned to be adjacent to a second edge 102 of the solar panel 100 opposite the first edge 101 in the second direction, and can further include an inner solar cell string IS positioned between the first and second solar cell strings OS1, OS2.

At this time, a plurality of wiring members 142 positioned in at least one of first and second solar cells 151 and 152 included in the first and second solar cell strings OS1 and OS2 and a third solar cell 153 included in the inner solar cell string IS include a first wiring member 1421 having a first width (or a first diameter, W1) and a second wiring member 1422 having a second width (or a second diameter, W2) less than the first width W1 and positioned outside or outer to the first wiring member 1421. For example, as shown in FIG. 4, the solar cell 150 including the first and second wiring members 1421 and 1422 can be used as at least one of the first to third solar cells 151, 152, and 153.

More specifically, in at least one of the plurality of first solar cells 151 included in the first solar cell string OS1 in the present embodiment, the second wiring member 1422 can be positioned to be adjacent to a first side of the first solar cell 151 adjacent to at least the first edge 101. In at least one of the plurality of second solar cells 152 included in the second solar cell string OS2, the second wiring member 1422 can be positioned adjacent to a second side of the second solar cell 152 adjacent to at least the second edge 102. Then, the second wiring member 1422 having a small width (or diameter) is positioned at positions adjacent to the first and second edges 101, 102 of the solar panel 100, which are parts in which the thickness of the sealing member 130 can be reduced during the lamination process. Then, a problem such as the wiring member 142 protruding through the sealing member 130 at a thin part of the sealing member 130 can be prevented, and even if a temperature cycle test for repeatedly changing the temperature of the solar panel 100 is performed, problems such as damage or disconnection of the wiring member 142 at the edge of the solar panel 100 can be prevented. This effect can be especially doubled in a structure in which, as in this embodiment, the wiring member 142 includes a circular or rounded part, and/or has a relatively large thickness (a thickness substantially equal to the width, for example, a thickness of 80% to 120% of the width, or a thickness of 1 mm or less) compared to the width (for example, 1 mm or less), or the first and second cover members 110 and 120 each have a glass substrate.

In particular, in this embodiment, the first and second cover members 110 and 120 each include the glass substrate, and a ratio of the thickness of the sealing member 130 (that is, the first or second sealing member 131 and 132) positioned on one side of the solar cell 150 to the first width W1 of the relatively large first wiring member 1421 can be two times or less. Here, the thickness (that is, a thickness of the first or second sealing member 131 and 132) of the sealing member 130 positioned on one side of the solar cell 150 can mean a thinnest thickness as a distance between the solar cell 150 and the first or second cover member 110 and 120. By using the first or second sealing member 131, 132 having the above-described thickness, the process cost can be reduced and the thickness and weight of the solar cell panel 100 can be reduced. On the other hand, since the first or second sealing member 131, 132 are difficult to be made to have a predetermined thickness or more, in order to increase the thickness, the first or second sealing member 131, 132 must be provided in a plurality of layers to form one first or second sealing member 131 and 132, the process cost can increase significantly, and accordingly, the thickness and weight of the solar panel 100 can also increase significantly. Accordingly, in the present embodiment, the first or second sealing member 131, 132 can be formed to have a predetermined thickness or less to reduce the number or thickness of layers constituting the sealing member 130. Problems such as damage and disconnection of the wiring member 142 at the first and second edges 101 and 102 of the solar panel 100 that can occur in this case can be prevented by positioning the second wiring member 1422 of relatively small width or diameter in the parts adjacent to the first and second edges 101 and 102.

For example, the ratio of the second width W2 of the second wiring member 1422 to the first width W1 of the first wiring member 1421 can be 0.5 or more (for example, 0.5 to 0.95). More specifically, the ratio of the second width W2 of the second wiring member 1422 to the first width W1 of the first wiring member 1421 can be 0.6 to 0.9. For example, the first width W1 of the first wiring member 142 can be 200 to 500 µm. Within this range, the plurality of solar cells 150 can be electrically connected to each other stably by the first and second wiring members 1421 and 1422, and the effect by the second wiring member 1422 can be effectively exhibited.

At this time, the number of second wiring members 1422 can be less than the number of first wiring members 1421 when viewed on one surface of the solar cell 150 including the first and second wiring members 1421 and 1422. The number of first wiring members 1421 is greater than the number of second wiring members 1422 so that carriers can be stably transmitted, and the second wiring members 1422 can be positioned in a less number only in necessary parts.

In the present embodiment, it is illustrated that each second wiring member 1422 is positioned on both sides of the first and second solar cells 151 and 152, and a plurality of first wiring members 1421 are positioned inside the second wiring member 1422 positioned on the both sides. In addition, each of the third solar cells 153 positioned on the inner solar cell string IS also has one second wiring member 1422 on both sides thereof, and the plurality of first wiring members 1421 can be positioned inside the second wiring members 1422 positioned on the both sides. Then, after manufacturing the solar cell strings OS1, OS2, and IS that include the plurality of solar cells 150 connected to each other so that each of the second wiring member 1422 is positioned on the both sides thereof and the first wiring member 1421 is positioned therein, they can be connected with the bus ribbon 145 or the like. Then, in manufacturing the solar panel 100, the first to third solar cells 151, 152 and 153 or the first and second solar cell strings OS1 and OS2 and the inner solar cell string IS are not distinguished, so that the manufacturing process can be simplified. However, the present invention is not limited thereto.

As a modified example, as shown in FIG. 8, a plurality of second wiring members 1422 can be provided when viewed from one side. In this case, in the first solar cell 151, the second wiring member 1422 can be provided in a plurality in a region S1 from the first side of the first solar cell 151 to 15% of a width of the first solar cell 151 along the second direction. At this time, the plurality of second wiring members 1422 positioned on one side of the first solar cell 151 can have the same width or diameter as each other, or as shown in FIG. 8, the plurality of second wiring members 1422a and 1422b can be positioned to be less in width or diameter as they are adjacent to the first side. Similarly, in the second solar cell 152, the second wiring member 1422 can be provided in a plurality in a region S2 from the second side of the second solar cell 152 to 15% of a width of the second solar cell 152 along the second direction. At this time, the plurality of second wiring members 1422 positioned on one side of the second solar cell 152 can have the same width or diameter as each other, or as shown in FIG. 8, the plurality of second wiring members 1422a and 1422b can be positioned to be less in width or diameter as they are adjacent to the second side.

In the above-described embodiments, it is illustrated that the second wiring members 1422 are positioned at both sides of the first to third solar cells 151, 152, and 153, and the width, diameter, number, and the like of the second wiring members 1422 positioned on the both sides are symmetrical to each other. Accordingly, although the first to third solar cells 151, 152, and 153 can have a symmetrical structure to have structural stability, the present invention is not limited thereto.

As another modified example, as shown in FIG. 9, in the first solar cell 151, one or a plurality of second wiring members 1422 are positioned only at a part adjacent to the first side, and the first wiring member 1421 can be positioned in the remaining part, so the first wiring member 1421 can be positioned instead of the second wiring member 1422 on the second side. Similarly, in the second solar cell 152, one or a plurality of second wiring members 1422 are positioned only at a part adjacent to the second side, and the first wiring member 1421 can be positioned in the remaining part, so the first wiring member 1421 can be positioned instead of the second wiring member 1422 on the first side. According to this, the second wiring member 1422 can be positioned only at a part where the second wiring member 1422 having a relatively small width should be positioned to increase the number of the first wiring members 1421, thereby stably transmitting the carriers. In addition, in the first and/or second solar cells 151, 152, the second wiring member 1422 is positioned on the first side and the second side, respectively, but the width, diameter, number, etc. of the second wiring members 1422 can be different from each other on the first side and the second side. Many other variations are possible.

Figure 10:
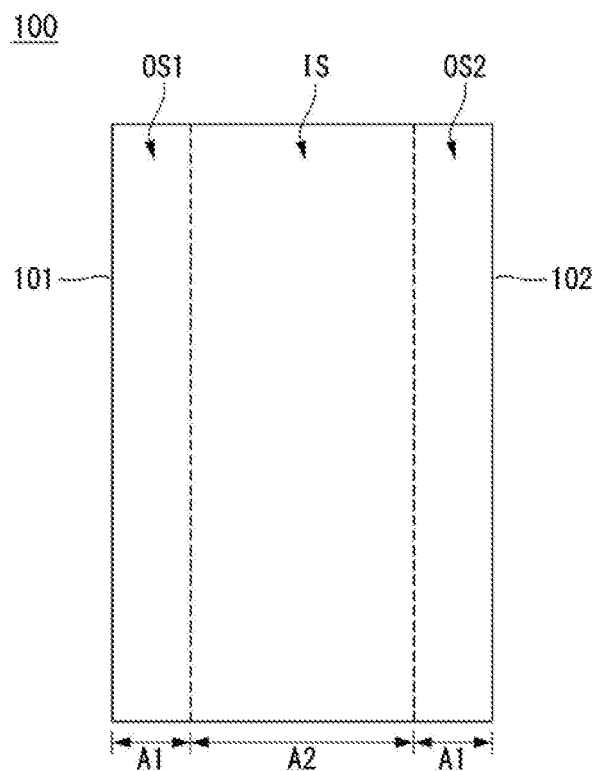
FIG. 10 is a plan view schematically illustrating a solar cell panel according to another embodiment of the present invention.
Figure 11:
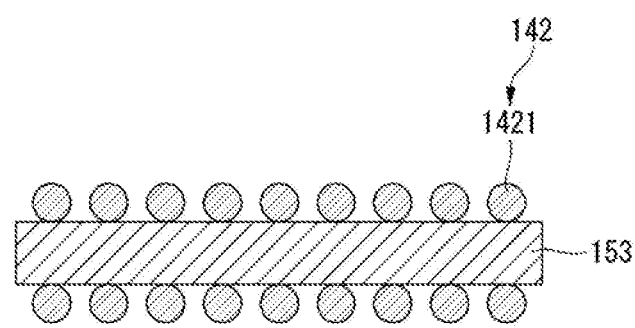
FIG. 11 is a cross-sectional view illustrating a third solar cell provided in a second region of a solar cell panel illustrated in FIG. 10.

In another embodiment, as shown in FIGS. 10 and 11, the first and second solar cells (see reference numerals 151 and 152 of FIGS. 7 to 9) included in the first and second solar cell strings OS1 and OS2 can form a first region A1 including the first wiring member 1421 and the second wiring member 1422 together, and the third solar cell 153 included in the inner solar cell string IS can form a second region A2 that does not include the second wiring member 1422, but includes only the plurality of first wiring members 1421 having substantially the same width. Then, the carrier can be stably transmitted by positioning the first wiring member 1421 only in the first region A1 where a problem such as disconnection of the wiring member 142 is likely to occur. For a brief illustration, FIG. 11 schematically illustrates the third solar cell 153 and the wiring member 142.

Figure 12:
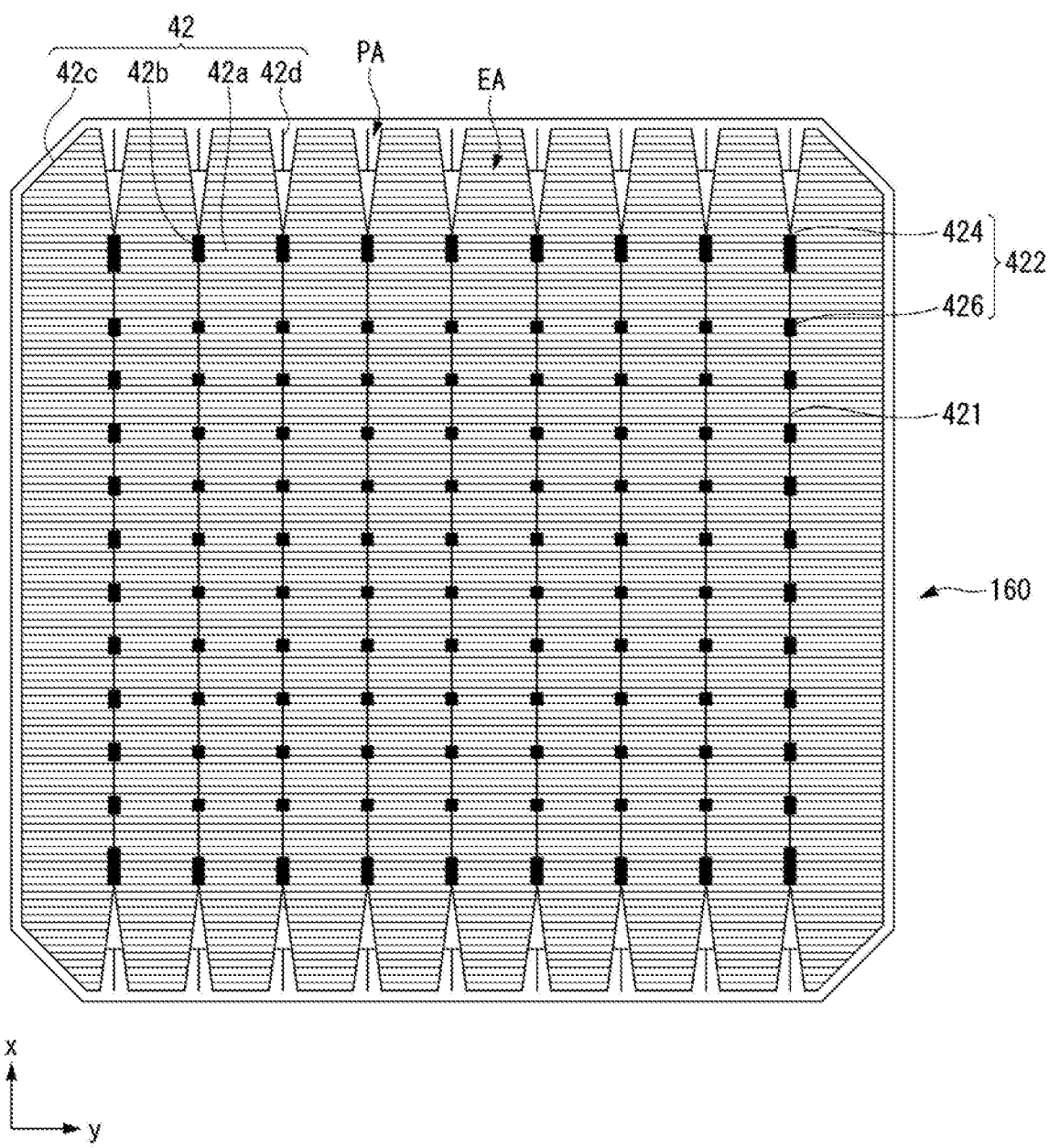
FIG. 12 is a front plan view of a solar cell included in a solar cell panel according to another embodiment of the present invention.

In addition, in the above-described embodiments, the pads 422 corresponding to the first and second wiring members 1421 and 1422 have substantially the same shape. However, the present invention is not limited thereto. As an example, as shown in FIG. 12, the number, area (for example, the length), etc. of the pad part 422 corresponding to the second wiring member 1422 can be greater than the number, area (for example, the length), etc. of the pad part 422 corresponding to the first wiring member 1421. As an example, as shown in FIG. 12, it is illustrated that a length of each of the first outer pad 424 and the first inner pad 426 corresponding to the second wiring member 1422 is longer than a length of each of the first outer pad 424 and the first inner pad 426 corresponding to the first wiring member 1421. In addition, in consideration of the case where the second wiring members 1422 are provided on the first and second sides of the solar cell 150, respectively, it is illustrated that the number, area, etc. of the pad part 422 of the first bus bar 42b adjacent to each of the first and second sides are different from the number, area, etc. of the first pad part 422 of the first bus bar 42b positioned therein.

However, the present invention is not limited thereto, and the length of at least one of the first outer pad 424 and the first inner pad 426 corresponding to the second wiring member 1422 can be longer than the length of at least one of the first outer pad 424 and the first inner pad 426 corresponding to the first wiring member 1421. Alternatively, the number of first pads 422 corresponding to the second wiring members 1422 can be greater than the number of first pads 422 corresponding to the first wiring members 1421. Although the first electrode 42 is illustrated as an example, at least one of the first and second electrodes 42 and 44 can have the above-described structure. In addition, the position, number, etc. of the bus bars 42b positioned in the first pad part 422 which differs in number, area, etc. according to the position, number, etc. of the second wiring member 1422 can also vary.

According to this, the number, area, etc. of the first pad part 422 corresponding to the second wiring member 1422, which can reduce the attachment characteristics due to a small width, are greater than the number, area, etc. of the first pad part 422 corresponding to the first wiring member 1421, so that the fall of the attachment characteristics of the wiring member 1422 can be prevented. However, the present invention is not limited thereto. Accordingly, the number, area, etc. (for example, length, width, etc.) of the first pads 422 corresponding to the second wiring member 1422 can be less than the number, area, etc. (for example, length, width, etc.) of the first pad part 422 corresponding to the first wiring member 1421. Many other variations are possible.

In the above-described embodiments, each of the above structures is applied, and the effect of the second wiring member 1422 can be greatly improved in the plurality of first solar cells 151 included in the first solar cell string OS1 and the plurality of second solar cells 152 included in the second solar cell string OS2. However, the present invention is not limited thereto. Even when the above-mentioned second wiring member 1422 is positioned only in at least one of the plurality of first solar cells 151 or at least one of the plurality of second solar cells 152, it is within the scope of the present invention. In addition, at least one of the plurality of first to third solar cells 151, 152, and 153 includes the first wiring member 1411 having the first width W1 and the second wiring member 1422 positioned outside the first width W1 and having the second width W2 less than the first width W1, so that the problems that can occur at the edge parts of the first, second, or third solar cells 151, 152, and 153 can be effectively prevented. Accordingly, this also belongs to the scope of the present invention.

According to the present embodiments, the problems such as damage and disconnection of the wiring member 142 that can occur at the edges 101 and 102 of the solar panel 100 can be prevented by a simple structure in which the first wiring member 1421 and the second wiring member 1422 are positioned. Thereby, the long-term reliability of the solar panel 100 can be improved while the solar panel 100 is manufactured by a simple process. This effect can be especially doubled in a structure in which the thickness of the sealing member 130 is below a certain level, the wiring member 142 includes a circular shape or rounded part or has a relatively large thickness compared to the width, or the first and second cover members 110 and 120 each have a glass substrate.

The features, structures, effects and the like according to the above-described embodiments are included in at least one embodiment of the present invention, and are not necessarily limited to only one embodiment. Furthermore, the features, structures, effects, and the like illustrated in the embodiments can be combined or modified in other embodiments by those skilled in the art to which the embodiments belong. Accordingly, contents related to these combinations and modifications should be construed as being included in the scope of the present invention.

What is claimed is:

1. A solar cell panel, comprising:
    a plurality of solar cell strings each including a plurality of solar cells and a plurality of wiring members connecting the plurality of solar cells in a first direction;
    a sealing member sealing the plurality of solar cell strings;
    a first cover member positioned on one surface of the plurality of solar cell strings on the sealing member; and
    a second cover member positioned on other surface of the plurality of solar cell strings on the sealing member,
    wherein the plurality of wiring members include a plurality of first wiring members each having a first width (w1), and a plurality of second wiring member,
    wherein widths of each of the plurality of second wiring members is less than the first width (w1),
    wherein the plurality of solar cell strings include a first solar cell string positioned adjacent to a first edge of the solar cell panel in a second direction intersecting the first direction, and a second solar cell string positioned adjacent to a second edge of the solar cell panel in the second direction,
    wherein, in at least one of a plurality of first solar cells included in the first solar cell string, the plurality of second wiring members are positioned adjacent to only a first side of a first solar cell adjacent to the first edge from among the plurality of first solar cells,
    wherein the widths of the plurality of second wiring members positioned adjacent to the first side decrease as each of the plurality of second wiring members disposed adjacent to the first side becomes closer to the first side,
    wherein, in at least one of a plurality of second solar cells included in the second solar cell string, the plurality of second wiring members are positioned adjacent to only a second side of a second solar cell adjacent to the second edge from among the plurality of second solar cells, and
    wherein the widths of the plurality of second wiring members positioned adjacent to the second side decrease as each of the plurality of second wiring members disposed adjacent to the second side becomes closer to the second side.

2. The solar cell panel of claim 1, wherein, in the at least one first solar cell, the plurality of second wiring members are provided in a region that extends from the first side to about 15% of a width of the at least one first solar cell along the second direction, and
    wherein, in the at least one second solar cell, the plurality of second wiring members are provided in a region that extends from the second side to about 15% of a width of the at least one second solar cell along the second direction.

3. The solar cell panel of claim 1, wherein the first width (w1) of the plurality of first wiring members is about 200 um to about 500 um, or wherein the first or second wiring members have a circular or rounded part.

4. The solar cell panel of claim 1, wherein a number of the plurality of second wiring members is less than a number of the plurality of first wiring members.

5. The solar cell panel of claim 1, wherein a thickness of the sealing member positioned on one side of the solar cell panel is two times or less with respect to the first width (w1) of the plurality of first wiring members.

6. The solar cell panel of claim 1, wherein each of the first and second cover members includes a glass substrate.

7. The solar cell panel of claim 1, wherein the plurality of solar cell strings further include at least one inner solar cell string positioned between the first solar cell string and the second solar cell string, and
    wherein the plurality of second wiring members are provided in the first and second solar cell strings, and the plurality of second wiring members are not provided in the inner solar cell string.

8. The solar cell panel of claim 1, wherein each of the first and second solar cells includes:
a semiconductor substrate;
a conductive type region positioned at one surface of the semiconductor substrate or on the one surface of the semiconductor substrate; and
an electrode electrically connected to the conductive type region,
wherein the electrode includes:
a plurality of finger lines parallel to each other; and
a plurality of bus bars respectively including a plurality of pads electrically connected to the plurality of finger lines and positioned along a direction intersecting the plurality of finger lines, and
wherein at least one of a size and a number of the plurality of pads of a bus bar corresponding to the plurality of second wiring members among the plurality of bus bar is greater than a size and a number of the plurality of pads of a bus bar corresponding to the first wiring member among the plurality of bus bars.

9. A solar cell panel, comprising:
a plurality of solar cells and a plurality of wiring members connecting the plurality of solar cells in a first direction;
a sealing member disposed on first and second surfaces of the plurality of solar cells;
a first cover member positioned on the sealing member that is on the first surface of the plurality of solar cells; and
a second cover member positioned on the sealing member that is on the second surface of the plurality of solar cells,
wherein the plurality of wiring members include a first wiring member having a first width (w1), and a plurality of second wiring members,
wherein widths of each of the plurality of second wiring members is less than the first width (w1),
wherein, in at least one of a plurality of first solar cells positioned adjacent to a first edge of the solar cell panel in a second direction intersecting the first direction, the plurality of second wiring members are positioned adjacent to only a first side of a first solar cell adjacent to the first edge from among the plurality of first solar cells,
wherein the widths of the plurality of second wiring members positioned adjacent to the first side decrease as each of the plurality of second wiring members disposed adjacent to the first side becomes closer to the first side,
wherein, in at least one of a plurality of second solar cells positioned adjacent to a second edge of the solar cell panel in the second direction, the plurality of second wiring members are positioned adjacent to only a second side of a second solar cell adjacent to the second edge from among the plurality of second solar cells, and
wherein the widths of the plurality of second wiring members positioned adjacent to the second side decreases as each of the plurality of second wiring members disposed adjacent to the second side becomes closer to the second side.

10. The solar cell panel of claim 9, wherein, in the first solar cell, the plurality of second wiring members are provided in a region that extends from the first side to about 15% of a width of the at least one first solar cell along the second direction, and
wherein, in the second solar cell, the plurality of second wiring members are provided in a region that extends from the second side to about 15% of a width of the at least one second solar cell along the second direction.

11. The solar cell panel of claim 9, wherein the first width (w1) of the plurality of first wiring members is about 200 um to about 500 um, or
wherein the first or second wiring members have a circular or rounded part.

12. The solar cell panel of claim 9, wherein a number of the plurality of second wiring members is less than a number of the plurality of first wiring members.

13. The solar cell panel of claim 9, wherein a thickness of the sealing member positioned on one side of the solar cell panel is two times or less with respect to the first width (w1) of the plurality of first wiring members.

14. The solar cell panel of claim 8, wherein a width of the plurality of pads of the bus bar corresponding to the plurality of second wiring members is greater than the width of each of the plurality of the second wirings members in the second direction.

15. The solar cell panel of claim 1, wherein thicknesses of the sealing member at the first and second edges of the solar cell panel are thinner than a thickness of the sealing member at an interior of the solar cell panel during lamination.

16. The solar cell panel of claim 9, wherein thicknesses of the sealing member at the first and second edges of the solar cell panel are thinner than a thickness of the sealing member at an interior of the solar cell panel during lamination.

17. The solar cell panel of claim 1, wherein a ratio (w2/w1) of a second width (w2) of the plurality of second wiring members to the first width (w1) of the plurality of first wiring members is about 0.6 to about 0.9.

* * * * *